(12) United States Patent
Kumar et al.

(10) Patent No.: US 9,260,781 B2
(45) Date of Patent: Feb. 16, 2016

(54) PROCESS TO DEPOSIT DIAMOND LIKE CARBON AS SURFACE OF A SHAPED OBJECT

(75) Inventors: Sushil Kumar, New Delhi (IN);
Prakash Narain Dixit, New Delhi (IN);
Chandra Mohan Singh Rauthan, New Delhi (IN)

(73) Assignee: Council of Scientific and Industrial Research, New Delhi (IN)

( * ) Notice: Subject to any disclaimer, the term of this patent is extended or adjusted under 35 U.S.C. 154(b) by 0 days.

(21) Appl. No.: 13/201,210

(22) PCT Filed: Jan. 27, 2010

(86) PCT No.: PCT/IB2010/000133
§ 371 (c)(1),
(2), (4) Date: Nov. 3, 2011

(87) PCT Pub. No.: WO2010/095011
PCT Pub. Date: Aug. 26, 2010

(65) Prior Publication Data
US 2012/0045592 A1 Feb. 23, 2012

(30) Foreign Application Priority Data
Feb. 18, 2009 (IN) .............................. 313/DEL/2009

(51) Int. Cl.
*C23C 16/27* (2006.01)
*C23C 16/26* (2006.01)
(Continued)

(52) U.S. Cl.
CPC ............... *C23C 16/26* (2013.01); *B65D 23/02* (2013.01); *C23C 16/0272* (2013.01); *C23C 16/045* (2013.01); *C23C 16/45578* (2013.01); *C23C 16/509* (2013.01); *H01J 37/32091* (2013.01)

(58) Field of Classification Search
None
See application file for complete search history.

(56) References Cited

U.S. PATENT DOCUMENTS 4,486,462 A * 12/1984 Asahi et al. .................... 427/576
5,679,412 A * 10/1997 Kuehnle et al. ................ 427/534
(Continued)

FOREIGN PATENT DOCUMENTS

EP 0773166 5/1997
EP 1357042 10/2003
(Continued)

OTHER PUBLICATIONS

Bonetti, L.F. et al. 'Adhesion studies of diamond-like carbon films deposited on Ti6Al4V substrate with a silicon interlayer' Thin Solid Films, Sep. 25, 2006, pp. 375-379, vol. 515, No. 1.
(Continued)

*Primary Examiner* — Joseph Miller, Jr.
(74) *Attorney, Agent, or Firm* — Bret E. Field; Makoto Tsunozaki; Bozicevic, Field & Francis LLP (57) ABSTRACT

A plasma based deposition process to deposit thin film on the inner surfaces of the shaped objects such as plastic or metallic object like bottles, hollow tubes etc. at room temperature has been developed. In present invention uniform hydrogenated amorphous carbon (also called Diamond-Like Carbon, DLC) films on inner surfaces of plastic bottles is successfully deposited. Applications of such product include entire food and drug industries. There is a huge demand of polyethylene terephthalate (PET) or polyethylene naphthalate (PEN)) bottles, meant for the storage of potable water, carbonated soft drinks, wines, medicines etc. However, the higher cost prohibits their wide, spread use. The cheaper alternative is to use plastic bottles inside coated with chemically inert material such as Diamond-Like Carbon (DLC) will be commercially viable. Inventor process can be scaled up for mass production. This process can also be used for coating on inner surface of metallic cane or tube with a carbide forming interlayer (like hydrogenated amorphous silicon) to get the DLC films with better adhesion to inner surface of metals.

17 Claims, 3 Drawing Sheets

(51) Int. Cl.
 B65D 23/02 (2006.01)
 C23C 16/02 (2006.01)
 C23C 16/04 (2006.01)
 C23C 16/455 (2006.01)
 C23C 16/509 (2006.01)
 H01J 37/32 (2006.01)

(56) References Cited

U.S. PATENT DOCUMENTS 5,789,139 A * 8/1998 Yamada et al. ............ 430/264
5,798,139 A * 8/1998 Nagashima et al. ........ 427/237
6,400,531 B1 * 6/2002 Inoue .................. G11B 5/6005
 360/235.1
2005/0181598 A1 * 8/2005 Kailasam .......... H01L 21/76802
 438/654
2010/0096393 A1 * 4/2010 Asahara et al. ............... 220/660
2012/0270362 A1 * 10/2012 Bakehe-Ananga et al. ..... 438/87

FOREIGN PATENT DOCUMENTS

EP 1400456 3/2004
WO 2008114475 9/2008

OTHER PUBLICATIONS

Ravi, B.N. et al. 'Deposition of diamond-like carbon films on aluminium substrates by RF-PECVD technique: Influence of process parameters' Diamond and Related Materials, Jan. 2007, pp. 90-97, vol. 16, No. 1.

* cited by examiner

PROCESS TO DEPOSIT DIAMOND LIKE CARBON AS SURFACE OF A SHAPED OBJECT

FIELD OF THE INVENTION

The present invention relates to an improved process to deposit diamond like carbon (DLC) films as protective coating on inner surface of a shaped object such as plastic or metallic bottles, more particularly, the present invention relates to an improved process using radio frequency and plasma discharge for the deposition of hard hydrogenated amorphous carbon (a-C:H, also called Diamond Like Carbon, DLC) thin films as protective coating on inner surface of hollow objects.

BACKGROUND OF THE INVENTION

It is well known that diamond-like carbon (DLC) films offer a wide range of exceptional physical, mechanical, tribological, electrical, optical and biomedical properties that make them commercially attractive for numerous industrial applications. Certain DLC films are extremely hard, chemically inert and also tribologically they show some of the lowest known friction and wear coefficients. Their optical and electrical properties are extraordinary and can be tailored to meet the specific requirements of a given application. Because of their excellent chemical inertness, these films are resistant to corrosive and/or oxidative attacks in acidic and saline media. Main constituent of DLC is carbon (and also hydrogen, varies from few atomic percent to 60 percent) and because of its inertness property, it is also a biocompatible material. The combination of such a wide range of outstanding properties in one material is rather uncommon, so DLC can be very useful in meeting the multifunctional applications. These films are now used in numerous industrial applications, including razor blades, magnetic hard discs, critical engine parts, mechanical face seals, scratch-resistant glasses, invasive and implantable medical devices and microelectromechanical systems (MEMS). However, high residual stress (up to 10 GPa), low adhesion strength (especially with the metallic substrates) and low thermal stability of DLC films are major hindrance to limit their practical applications. However, these problems of DLC have been solved to an extent involving; compositional modification, multilayer architecture, interface modification etc. [A. A Voevodin, S. D. Walck, J. S. Zabinski, Wear, 203-204, 516, (1997); H. Dimigen and C. P. Klages, Surf. Coat. Technol., 49(1-3), 543, (1993); M. Gioti, S. Logothetidis and C. Charitidis, Appl. Phys. Lett., 73(2), 184, (1998); A.L. Baia Neto, R. A. Santo, F. L. Freire Jr., S. S. Camargo Jr., R. Carius, F. Finger, W. Beyer, Thin Solid Films 293(1-2), 206,(1997); J. C. Damasceno, S. S. Camargo Jr., F. L. Freire Jr., R. Carius, Surf. Coat. Technol. 133-134, 247, 2000)]

In a separate study some members of inventors have also suggested some possible ways to solve the problem of stresses in DLC films [Sushil Kumar, P. N. Dixit, D. Sarangi and R. Bhattacharyya, J. Appl. Phys. 85, 3866(1999); Sushil Kumar, D. Sarangi, P. N. Dixit, O. S. Panwar & R. Bhattacharyya, Thin Solid Films 346, 130 (1999)].

There are several excellent review articles written on DLC and other carbon based materials, which also emphasis that stress and adhesion are major limitation of DLC for realization of industrial applications [A. Grill, Surf. Coat. Technol. 94, 507(1997);H.C. Tsai and D. B. Bigy, J. Vac. Sci. Technol. 5, 3287(1987); A. Erdemir, O. L. Eryilmaz and G. Fenske, J. Vac. Sci. Technol. A 18, 1987(2000); J. Robertson Mater. Sci. Eng. 37, 129(2002)].

Most DLC films are structurally amorphous and the deposition methods and carbon sources used, the structural chemistry of the resultant films may also differ substantially, and such differences may, in turn, lead to large variations in their properties. DLC films are primarily made of $sp^2$- and $sp^3$-bonded carbon atoms that are extracted from carbon-containing sources, such as solid carbon targets, liquid or gaseous forms of hydrocarbons [J. Robertson, Mater. Sci. Eng. 37, 129(2002)]. The relative amount of $sp^2$ versus $sp^3$-bonded carbon atoms (essentially depends on energy of carbon ions while film formation) varies from one DLC films to another. Films with a high proportion of $sp^2$-bonded carbon atoms tend to be relatively soft and behave more like graphite during tribological tests, while films with more $sp^3$-bonded carbons are more like diamond, and hence they are hard and provide impressive tribological properties [J. P. Sullivan, T. A. Friedmann and K. Hjort, MRS Bull. 26, 309(2001)], are called tetrahedral amorphous carbon (ta-C, hydrogen free DLC). The atomic percent of hydrogen in these hydrogen free DLC is very low, normally less than one atomic percent. If the films are derived from a hydrocarbon source (using gaseous source, such as acetylene/methane or liquid source such as benzene/cyclohexane) then large amounts of hydrogen may also be present within their structures, such group of diamond-like carbon coatings is called hydrogenated amorphous carbon, a-C:H (H-DLC). The hydrogen content in these films is primarily independent variable that can differ considerably depending on the deposition method, hydrogen source gas and the deposition parameters used, which determines the structure and hence the properties of H-DLC. Incorporation of hydrogen in these films deposited by PECVD or sputtering, is generally required in order to obtain "diamond like" properties (reasonably hard, wide optical gap and high electrical resistivity) and to stablize the diamond structure by passivating dangling bonds by maintaining the $sp^3$ hybridization configuration [C. Donnet and A. Grill, Surf. Coat. Technol. 94-95, 456 (1997); H. C. Tsai and D. B. Bogy, J. Vac. Sci. Technol. A 5, 3287 (1987); J. C. Angus and F. Jansen, J. Vac. Sci. Technol. A 6, 1778 (1988)]. The hydrogen content critically determines film structure at the atomic level and therefore, the physical properties of the films.

Compared with hydrogen-free DLC's (like ta-C), hydrogenated DLC's (like a-C:H) films are relatively soft but exhibit some of the lowest friction and wear coefficients. In particular, amorphous hydrogenated carbon (a-C:H, DLC) films have been extensively studied and have found a large number of applications [J. Robertson, Mat. Sci. Eng.R, 37(4-6), (2002), 129]. In general, ta-C films are more wear-resistant compared to the a-C:H films due to the higher hardness of ta-C. The wear of counterparts sliding against the ta-C coating is higher compared to the a-C:H coating due to higher surface roughness combined with the higher hardness of the ta-C coating. However, by doping the ta-C coating with hydrogen, the coefficient of friction reduced as the hydrogen content of the coating is increased. Friction properties of a-C:H and ta-C coating can be related to the friction properties of graphite, which verifies the importance of graphite formation and the availability of hydrogen for low friction properties of the a-C:H and ta-C coating. Thus, hydrogen is very important for obtaining diamond like properties.

In addition to H free DLC (a-C or to-C) and H-DLC (a-C: H), there exist several more DLC's consisting of different kinds of alloying elements, discrete compound phases in a nanocomposite and superlattice or nano-layered coating architectures. These DLC films are realized to combat residual stresses and adhesion strength of pure DLC. In particular, doping of DLC with certain metals, metalloids and gaseous species (such as Ti, B, S, Si, Cr, Ni, Ta, Cu, F, W and N) has become popular for various applications. The presence or absence of certain elemental species, such as hydrogen, nitrogen, silicon, tungsten, titanium and fluorine, in the microstructure of DLC can play significant role in deciding their properties.

There are several techniques (mainly PVD & CVD based) used to deposit DLC based hard and protective coatings on the outer surfaces of components. For irregular surfaces ion beam method is preferred or the components itself used as cathode. However, coating on inner surfaces remains a challenge and limited information is available in the literature. A hollow cathode plasma immersion ion processing method has been developed for the deposition of Si-DLC as hard and protective coating on the internal surface of stainless steel pipe [Boardman et al. US Patent Application, Pub. No. US2006/0011468 A1]. In another work, small hollow tube has been coated with Si-DLC [K. Nakanishi et al., Surface and Coating Technology, 2005; Yukimura et al. Surface and Coating Technology, 169-170, 4115(2003)].

Deposition of H free DLC on inner surface of cylindrical shaped hollows objects like bottle or tube seems to be complex. Carbon targets are used for the deposition of H-free DLC, as in any of the techniques like pulsed laser deposition (PLD), sputtering and vacuum arc. This makes the process very complex to create the plasma inside a bottle or tube. However, for this kind process, material has to be inserted inside the tube and then sputtering or arcing has to be made inside the tube [H. Wesemeyer, H. Veltrop, U.S. Pat. No. 5,026,466; W. F. Hensaw, J. R. White, A. Niiler, U.S. Pat. No. 4,407,712].

In addition, deposition of DLC on plastic surface has technological importance. Recently, the deposition of DLC on polymeric substrates has attracted considerable attention for various applications, like for plastic optics [A. Kimura, H. Kodama, T. Suzuki, J. Vac. Sci. Technol., A 21 (2003) 515.], for food packaging [Y. B. Guo, F. C. N. Hong, Diamond Relat. Mater. 12 (2003) 946.], for biomedical products [Y. Ohgoe, K. K. Hirakuri, K. Tsuchimoto, G. Friedbacher, O. Miyashita, Surf. Coat. Technol. 184 (2004) 263.] etc. Different polymeric substrates, such as Polycarbonate (PC), Polymethylmethacrylate (PMMA), Polyethylene terephthalate (PET) and Polyvinyl chloride (PVC) have already been coated with amorphous carbon films leading to a significant improvement of their chemical and mechanical surface properties [X. T. Zhou, S. T. Lee, I. Bello, A. C. Cheung, D. S. Chiu, Y. W. Lam, C. S. Lee, K. M. Leung, X. M. He, Surf Coat. Technol. 123 (2000) 273; N. K. Cuong, M. Tahara, N. Yamauchi, T. Sone, Surf Coat. Technol. 174-175 (2003) 1024; T. Tanaka, M. Yoshida, M. Shinohara, T. Takagi, J. Vac. Sci. Technol., A 20 (2002) 625]. ta-C, a-C:H, silicon doped tetrahedral amorphous carbon (ta-C:Si:H) and silicon doped hydrogenated amorphous carbon (a-C:H:Si) produced by PECVD and FCVA (Filtered Cathodic Vacuum Arc) techniques on PET and polycarbonate (PC) substrates have been investigated as gas barrier coating [G. A. Abbas, S. S. Roy, P. Papakonstantinous and J. A. McLaughlin, Carbon43, 303(2005)]. It has been observed that there is an improvement of oxygen barrier of PET film with DLC coating by plasma source ion implantation [M. Yoshida, T. Tanaka, S. Watanabe, M. Shinohara, J. W. Lee and T. Takagi, Surface and Coating Technology 174-175, 1033(2003)]. Two dimensional modeling and diagnostics of plasma for DLC deposition on PET has also been investigated [E. Amanatides, P. Gkotsis, C. Syndrevelis and D. Mataras, Diamond & Related Materials 15, 904(2006)]. Plasma Enhanced CVD has a definitive advantage for the growth of these films, because it permits the deposition on these sensitive polymer substrates even at room temperature [J. Robertson, Mater. Sci. Eng., R Rep. 37 (2002) 129]. DLC growth by plasma CVD technique is capable of a uniform deposition over large area on flexible substrates like plastic sheets. Polyethylene terephthalate (PET) is a useful plastic that can be blown into containers and bottles. PET has more flexibility in size and shape of packaging than metal cans. However, metal cans are easier to transport and handle than glass. Glass is breakable, heavy, and does not provide good portability. However, PET has a finite gas permeability that can limit the shelf life of some food and drink products. The addition of a gas-impermeable coating onto the inside wall of a standard PET bottle has long been considered as a way to improve the packaging for beer, fruit juice, and carbonated soft drinks, where the permeation of carbon dioxide, oxygen, and water needs to be suppressed. As these problems can be solved by using suitable coating on inner surface of plastic containers (like PET bottles); however, there are some essential specifications of coating required to solve the above mentioned problems. In this direction efforts have already been made as described in subsequent paragraphs.

There is an important invention which describes usages of pet containers for food and drinks containing recycled resin and having DLC coating deposited on inner surface (H. Kenichi and K. Tsuyoshi, US Patent Application 20030087030). In an another invention by other workers, describes about the amorphous carbon coating with polymer tendency on bottle or flask like container (D. David, R Jean-Micl, C. Patrick, B. Aima, B. Nasser and O. Fabrice, US Patent Application 20020179603). There is a joint patent by M/s Mitsubishi Shoji Plastics Corporation, M/s Hokkai Can Co., Ltd. and M/s Kirin Brewery Company Limited (M. Shigeki et al. U.S. Pat. No. 7,166,336, JP1999000139211, JP1999000299806 and JP2000000048386) that describes about an apparatus for producing DLC film-coated plastic containers. In our invention outer electrode consists of a single electrode, however, in the said joined patent, in the apparatus, the outer electrode consists of three parts. The outer electrode unit comprises of a bottom electrode disposed along the bottom of the plastic container, and a body electrode disposed along the body of the plastic container, and the upper edge of the bottom electrode is positioned below the center between the top and the bottom of the plastic container. There are few more patents filed by same group about plastic containers coated with diamond-like carbon film (JP2001232714A2 and JP2007070734A2).

There is another patent which discusses about production of device for DLC film-coating on plastic container and production method thereof (H. Kenichi et al. U.S. Pat. No. 6,924, 001, WO2000JP0009202, WO02051707A1, CN1479683A). They have also talked about plastic container for liquid medicine (EP1258234B1, WO0162202A1) and plastic container for liquid containing volatile organic substance (WO0162605A1,JP2000000048387). They have also obtained patent for plastic container for dry solid food (WO0162624A1, JP2000000048389). In another patent, H. Kenichi et al. (WO0132513A1) describes about the nitrogen-free DLC film coated plastic container, and method and apparatus for manufacturing the same. Further, in the same area a patent by H. Kenichi et al. (U.S. Pat. No. 7,029,752, JP2000000048388) describes about plastic container for liquid medicine and method of storing and recovering liquid medicine. Another patent (CN1207173C, JP2000000048387) describes about plastic container for liquid with diamond-like carbon film formed on inner surface.

K. Ryota et al. (U.S. Pat. No. 5,922,418, JP1996000215557) describes about the method of forming a DLC film over the inner surface of guide bush.

In another patent (S. Osamu et al., U.S. Pat. No. 5,965,217, JP1996000266878) a method of forming DLC films over inner surface of cylindrical member is described. This particular patent relates to a method of forming a two-layer intermediate film over the inner surface of a cylinder, such as a bushing, with a DLC film being formed on the intermediate film with a uniform thickness by using an auxiliary electrode, which enhanced abrasion resistance of the inner surface.

In another patent (S. Eihaku U.S. Pat. No. 629,422, JP 1997000034508, JP1997000061338) a method and apparatus for producing plastic container having carbon film coating is described.

In another patent (N. Kazufumi et al. U.S. Pat. No. 6,805, 931, JP1994000189223, EP0773166B1) which describes about the plastic container coated with carbon film. This particular patent is about a plastic container having diamond like carbon film formed on the inner surface of the container made of plastic material. The thickness of the diamond like carbon film is within a range from 0.05 to 5 micron. The container coated with the diamond like carbon film can be used for a returnable bottle for beverage.

There is a European patent (N. Ikenaga EP1229068A1, JP2001000029176) which describes about method and apparatus for modifying the inner surface of containers made of polymeric compound. In this patent, DC high voltage pulses are applied from a high voltage power source to an electrode to implant ions into the interior side surface of the PET container so that the surface itself is modified into DLC.

In another patent (M. Akio, JP2007126746A2) describes about diamond-like carbon thin film as gas barrier formed on the surface plastic bottle.

A suitable coating must have sufficient hardness, relatively enough density; coating should be deposited at a high growth rate to make a viable industrial process, but without exerting a large heat load, which would soften the PET substrate (like in microwave process or high energy ions bombardment in ion assisted process); be biocompatible and food contact safe; and be optically tailorable (transparent or as required transparency; as some medicine/drugs need to be kept in brown/ dark colored bottles). DLC, in principle, satisfies all these requirements. In addition, the optical bandgap can be varied over a wide range, so that it is possible to form an optically semitransparent coating on colored PET bottles, such as amber or green beer bottles, or brown/dark colored bottles, such as those used for medicine/drug bottles or a transparent coating for transparent bottles, such as those used for carbonated soft drinks or water. Ideally, ta-C would be the best material, but arc and PLD systems are not suited to coat the interior of plastic bottles. However, plasma system is ideal for this type of coating. Plasma enhanced CVD has a definitive advantage for the growth of these films, because it permits the deposition on these sensitive polymer substrates even at room temperature [J. Robertson, Mater. Sci. Eng., R Rep. 37 (2002) 129]. Thus, a-C:H is being used for this purpose by many groups [N. Boutroy, Y. Pernel, J. M. Rius, F Auger, H. J. von Bardeleben, J. L. Cantin, F. Abel, A. Zeinert, C. Casiraghi, A. C. Ferrari and J. Robertson, Diamond Relat. Mater. (2006) 15, 921 ; G. A. Abbas, S. S. Roy, P. Papakonstantinous and J. A. McLaughlin, Carbon 43, 303 (2005); M. Yoshida, T. Tanaka, S. Watanabe, M. Shinohara, J. W. Lee and T. Takagi, Surface and Coating Technology 174-175, 1033 (2003); S. Yamamoto, H. Kodama, T. Hasebe, A. Shirakura and T. Suzuki, Diamond Relat. Mater. (2005) 14, 1112]. Silicon oxide coating has also been used as gas barrier for improvement of transparent plastic films [T. Krug, Society of Vacuum Coaters, Proc. Of $33^{rd}$ Annual Tech. Conf. 1990, P.163; T. Krug, R. Ludwig, G. Steiniger, Society of Vacuum Coaters, $36^{th}$ Annual Tech. Conf. Proc. 1993, p. 302]. An interfacial layer between PET and silicon dioxide has also been used to overcome intrinsic brittleness of silicon dioxide which enabled the production of commercial level silica coated PET bottles [Toyo Seikan Kaisha, JP2003328131A2]. Toyo Seikan Kaisha Ltd., Toppan Printing Co. Ltd., and SIG Corpoplast GmbH Co. have developed silicon dioxide coating on inside of bottles using PECVD technique. The Coca-Cola Company has tried to coat these coating on outside of bottles [Coca-Cola Company, Patent No. WO0008226A2]. Microwave plasma system is in use in market to deposit a-C:H on inner surface of PET bottles [N. Boutroy, Y. Pernel, J. M. Rius, F Auger, H. J. von Bardeleben, J. L. Cantin, F. Abel, A. Zeinert, C. Casiraghi, A. C. Ferrari and J. Robertson, Diamond Relat. Mater. (2006) 15, 921]. M/s Sidel Inc. has developed DLC coating technology which they called as 'Actis' i.e. amorphous carbon treatment on internal surface [Sidel WO9949991A1]. Sidel process is basically a microwave-assisted process which excites the gas into plasma to deposit DLC layer on the inside of bottle. However, microwave systems and related components are not cost effective and one has to be careful about overheating of the plastic bottles.

A modified plasma based ion implantation (PBII) technique has also been used to deposit DLC coating on inner walls of PET bottles [M. Ikeyam, S. Miyagawa, Y. Miyagawa, Y. Hayakawa and T. Miyajima, Surface & Coating Technology 201, 8112(2007); M. Ikeyam, S. Miyagawa, S. Nakao, J. Choi and T. Miyajima, Nuclear Instruments and Methods in Physics Research B 257, 741 (2007)]. However, they have used high voltage pulse power for the generation of plasma which could impose some restriction to process. Very high power is used to get sufficient ion energy for the deposition of DLC films as in their process surface of bottle is in contact with ground potential and it is not a ion assisted process.

Kirin Brewery Co. Ltd. and Samco International, Inc. together have developed the first commercialized system for gas barrier DLC coating for PET bottles [Kirin Brewery, JP08053116A2; Kirin Brewery, Samco International JP2788412; A. Shirakura, M. Nakaya, Y. Koga, H. Kodama, T. Hasbe and T. Suzuki, Thin Solid Films 494, 84(2006)]. Since then many machine manufactures have made extensive efforts for the commercialization of DLC as gas barrier coating for PET bottles [E. Shimamura, K. Nagashima, A. Shirakura, Proceedings of $10^{th}$ IAPRI Conference, Melbourne, 1997, p.251; The Coca-Cola Company WO0008226A2; Sidel WO9949991A1]. Kirin Brewery Co. Ltd. has got manufactured a commercial DLC coating machine by Mitsubishi Heavy Industries, Inc. having a capacity of 18000 bottles per hours [A. Shirakura, M. Nakaya, Y. Koga, H. Kodama, T. Hasebe and T. Suzuki, Thin Solid Films 494, 84 (2006)]. It is revealed from the description of machine that separate chamber has been used for accommodating bottles during mass production.

Drawback of the Prior Art
1. There is limited scope for scale up for coating on inner surface of large number of bottles with proper Rf shielding, otherwise there is possibility of plasma discharge outside the plastic bottle during the deposition of DLC.
2. There is damage of inner surface of bottles due to ion bombardment on inner surface of bottle
3. High residual stress, low adhesion strength and low thermal stability of DLC films are major hindrances to limit the practical applications of the DLC coated bottle.

To overcome all the aforementioned barriers there is a need to develop a more efficient process and apparatus for the deposition of DLC coating on inner surface of a shaped object.

Objects of the Present Invention

The main object of the present invention is to provide an improved process to deposit diamond like carbon film as protective coating on inner surface of a shaped object such as plastic or metallic bottles, which obviates at least one of the drawbacks of the prior art.

Another object of the present invention is to provide an apparatus for DLC coating on inner walls shaped object.

Yet another object is to provide a cost effective process and apparatus for DLC coating on inner walls of plastic bottles suitable for mass production.

SUMMARY OF THE INVENTION

Accordingly, the present invention provides an improved process for deposition of diamond like carbon (DLC) films as protective coating on inner surface of a shaped object such as plastic or metallic container, bottle and the said process comprising the steps of i. cleaning the inner surface of the shaped object and placing the said object inside a hollow cathode plasma enhanced chemical vapor deposition apparatus kept in a vacuum chamber;

ii. applying a base pressure of $10^{-5}$ to $10^{-6}$ torr to the vacuum chamber for removing the residual gases;

iii. injecting a hydrocarbon gas such as acetylene($C_2H_2$) or methane ($CH_4$) at partial pressure in the range of 10-90% into the shaped object through holes of an inner electrode;

iv. applying a radio frequency of 13.56 MHz for a time period in the range of 8 to 10 mins to an outer electrode of the hollow cathode and the said outer electrode being in contact with the body of the shaped object is connected to a power supply and the grounded electrode lying inside the said object being used for delivery of hydrocarbon gas, the said outer electrode being insulated from outside using an insulating sheet and entire assembly being covered with a sheet which is at ground potential;

v. depositing the DLC films at power density in the range of 50-2000 mW/cm$^2$, gas flow in the range of 5-100 sccm, chamber pressure in the range of 5-100 m torr and self bias in the range of 50-200 volts, temperature in the range of 25-30° C.;

vi. breaking of vacuum by inserting the air, to take out the DLC coated bottle from the chamber.

In an embodiment of the present invention the shaped object or the container is a plastic or metal container.

In another embodiment of the present invention the step of depositing of diamond like carbon (DLC) film is initially carried out at a very low self bias in the range of 50-70 volts for 1 to 2 minutes on the inner surface of plastic or metallic object used and thereafter self bias is increased in the range of 150-200 volts gradually for 8 to 10 minutes to get the hard DLC films.

In still another an embodiment of the present invention, the shaped object is selected from the group comprising of spherical, cubic, cylindrical or rectangular shaped objects and such similar shaped objects and the shape of hollow cathode used for DLC coating is modified as per the shape of the object used for coating.

In a further embodiment of the present invention, hydrocarbon gas used is selected from the group comprising acetylene, methane, benzene, cyclohexane, n-hexane, toluene etc.

In still another embodiment of the present invention, hydrocarbon gas used is diluted in argon. However, there is an advantage of using argon with hydrocarbon i.e. dense films with more sp$^3$ carbon, to obtain optimum diamond like properties having amorphous structure consisting of sp$^2$, sp$^3$ carbon and also hydrogen. At optimum argon dilution in the range of 40-60% DLC films are harder in the range of 12-15 GPa compared to without argon dilution in the range of 8-10 GPa.

In a further embodiment of the present invention hydrocarbon gas is diluted in argon.

In yet another embodiment of the present invention, the process is optionally carried out without using argon.

In another embodiment of the present invention, the self bias applied is directly proportional to applied Rf power and inversely proportional to pressure and is controlled to obtain the desired properties of DLC films over inner surface of plastic or metallic object.

In still another embodiment of the present invention, the DLC films coated plastic or metallic object is useful for various storage applications, such as bottles meant for the storage of potable water, carbonated soft drinks, wines, medicines etc.

In yet another embodiment of the present invention, thin hydrogenated amorphous silicon (a-Si:H) layer can be optionally deposited using silane (SiH$_4$) plasma discharge prior to deposition of thick DLC layer of about a micron or so in certain applications wherein thick DLC may be required on inner surface of plastic or metallic object to get better adhesion of DLC with inner surface of plastic or metallic object.

In a further embodiment of the present invention, to avoid ion bombardment on the surface of PET (or any other plastic) bottles, the energy of ions which has been used in the invented process is just sufficient (~60-80 eV, corresponding self bias was (150-200 Volts) to achieve the hard enough (8-12 GPa) diamond like carbon (DLC) films with better adhesion on the inner surface of bottles.

In a further more embodiment of the present invented process, characterized in initially few nano meters of diamond like carbon (DLC) film was deposited at a very low self bias (~50-70 volts) on the inner surface of bottles then self bias was increased gradually to 150-200 Volts, which makes it possible to minimize or completely avoid the damage of inner surface of bottles in the invented process.

In one more embodiment of the present invention, bottle was placed close (just touching) to power electrode (cathode) where RF power (13.56 MHz) was applied.

In another embodiment of the present invention, the power density used in step (v) is preferably in the range of 300-500 mW/cm$^2$.

In still another embodiment of the present invention, the pressure used in step (v) is preferably in the range of 25-50 mTorr.

In yet another embodiment of the present invention, the self bias used in step (v) initially in the range of 50-57 volts then in the range of 150-200 volts.

In a further embodiment of the present invention, the performance of these DLC coatings depends upon the process parameters of the deposited films and the hardness of these coating varies with the change of process parameter, as an example from 8 GPa (corresponding stress ~0.2 GPa, hardness and stress were estimated by microhardness tester and laser scanning stress measurement setup, respectively) to 12 GPa (corresponding stress ~0.5 GPa) with the increase of self bias from −150V to −200V.

In a further more embodiment of the present invention, deposition parameters such as gas flow, pressure, power density, self bias etc. were varied to get optimum diamond like properties of these films. These films were characterized by Scanning Electron Microscopy (SEM), Atomic Force Microscopy (AFM), Microhardenss tester, laser scanning based stress measurement setup, optical transmission (in the visible and Infrared range), Electrical conductivity etc. All these measurements confirm diamond like properties of the films.

In one more embodiment of the present invention, the process can also be used for coating on inner surface of metallic cane or tube. However, a carbide forming interlayer (like hydrogenated amorphous silicon) is required to get the DLC films with better adhesion to inner surface of metals.

The present invention also provides an apparatus for the deposition of diamond like carbon (DLC) film as protective coating on inner surface of a shaped object such as a container, said apparatus comprising:
a vacuum chamber;
an inner and outer electrode being located inside the said vacuum chamber; said outer electrode comprising an inner wall formed to accommodate the shaped object;
a pumping port to insert gaseous mixture being attached to the said inner electrode; plurality of openings being provided with the inner electrode for discharging the gaseous mixture inside the container;
a radio frequency power source coupled with the outer electrode for a predetermined radio frequency to the outer electrode.

In an embodiment of the present invention the outer electrode is shielded by a metallic sheet which at ground potential to provide radio frequency shielding with no possibility of plasma discharge outside the container.

In another embodiment of the present invention an insulator is disposed between the metal sheet and the container.

In still another embodiment of the present invention the metal sheet is selected from the group comprising stainless steel, copper, aluminum, titanium, tungsten, molybdenum.

In yet another embodiment of the present invention, the apparatus can be suitably constructed for mass production as in the construction there is scope for scale up for coating on inner surface of large number of bottles with proper radio frequency shielding.

In a further embodiment of the present invention, in the apparatus outer electrode is single electrode is called cathode characterized by separation by insulator from outside and the whole assembly is covered by metallic sheet at ground potential.

In a further more embodiment of the present invention, proper radio frequency shielding is provided to avoid plasma discharge outside the plastic or metallic object.

DETAILED DESCRIPTION OF THE PRESENT INVENTION

Figure 1:
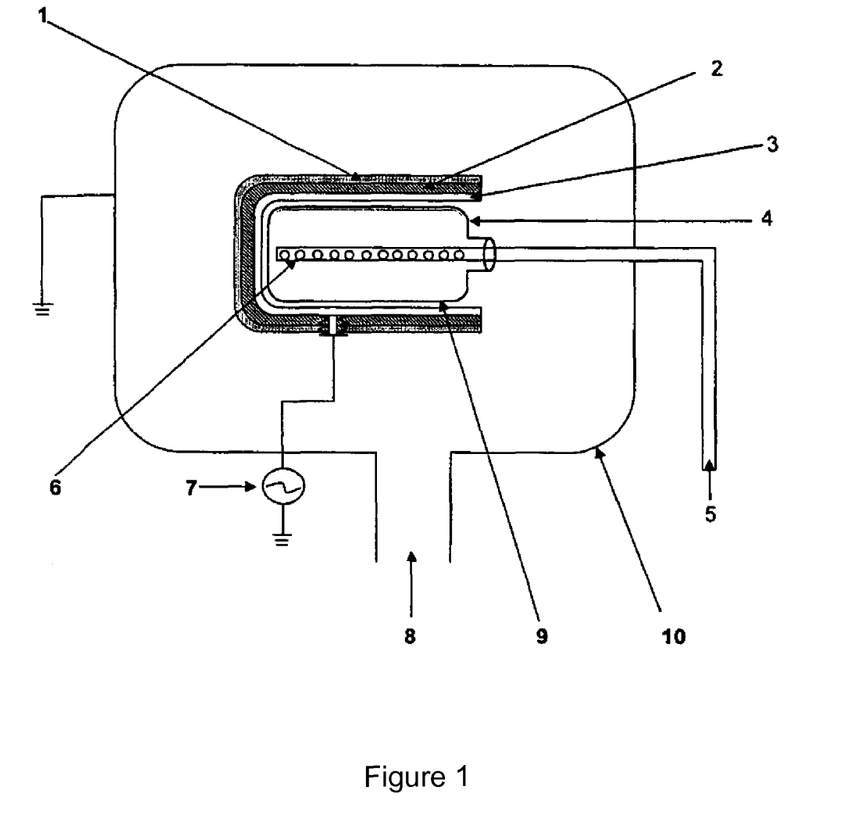
FIG. 1 illustrates the apparatus used for the deposition of DLC films to the inner surface of plastic bottle by generating capacitively coupled hydrocarbon plasma between inner and outer electrode according to an embodiment of the present inventive.

FIG. 1. Describes the apparatus used for the deposition of DLC films to the inner surface of plastic bottle by generating capacitively coupled hydrocarbon plasma between inner and outer electrode. Numbers marked in the sheet 01/03 FIG. 1 designated as (1) sheet at ground potential (2) insulating sheet (3) outer electrode/cathode (4) plastic bottle (5) port to insert gaseous mixture of hydrocarbon and argon (6) inner electrode with hole for inserting gases into the bottle (7) radio frequency (13.56 MHz) power (8) pumping port connected to vacuum pumps (9) DLC film (10) chamber. The inner electrode that lies inside the bottles is grounded while the outer electrode is outside, touching the body of bottle which is connected to the radio frequency power supply. Outer electrode is hollow and cylindrical in shape. The outer electrode is insulated from outside with Pyrex sheet (5 mm thick) and all these are covered with SS sheet at ground potential. A plastic bottle is placed in hollow cathode in the chamber which is to be evacuated to a vacuum better than $10^{-5}$ torr. Hydrocarbon gas such as acetylene ($C_2H_2$) or methane ($CH_4$) diluted with argon (Ar) is to be injected into the bottle through inner electrode. Radio frequency power of 13.56 MHz is to be applied to the outer electrode (called cathode) to generate hydrocarbon plasma and DLC film was deposited on the inner surface of bottles as shown in FIG. 1

Figure 2:
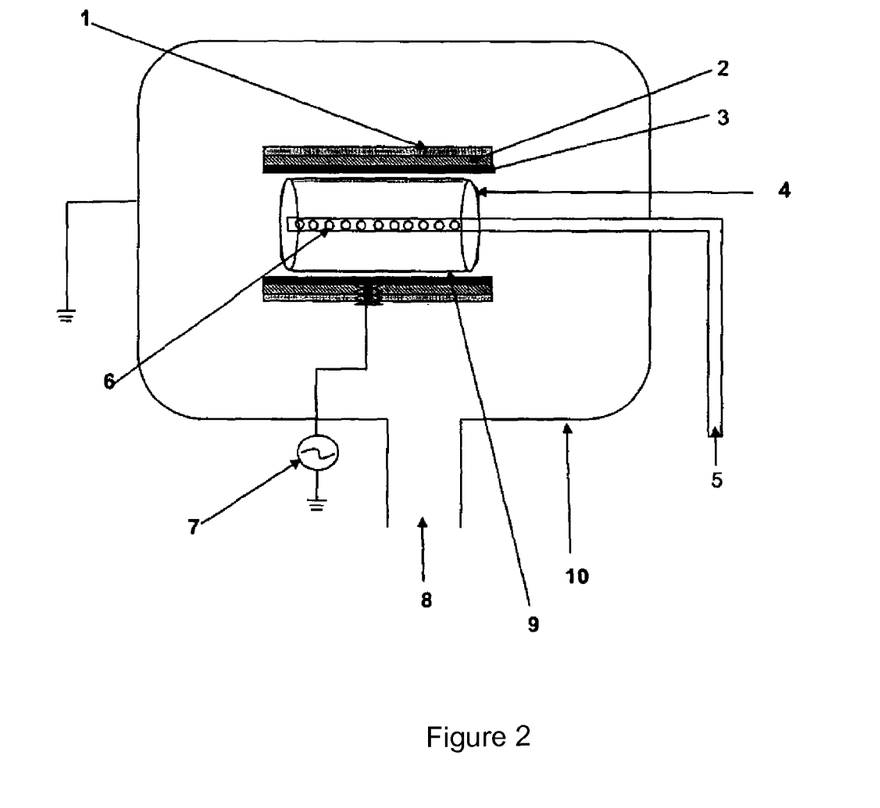
FIG. 2 shows the apparatus used for the deposition of DLC films to the inner surface of cylindrical shaped plastic tube by generating capacitively coupled hydrocarbon plasma between inner and outer electrode according to an embodiment of the present invention.

FIG. 2 describes the apparatus used for the deposition of DLC films to the inner surface of cylindrical shaped plastic tube by generating capacitively coupled hydrocarbon plasma between inner and outer electrode. Numbers marked in the sheet 02/03 (FIG. 2) designated as (1) sheet at ground potential (2) insulating sheet (3) outer electrode/cathode (4) cylindrical tube (5) port to insert gaseous mixture of hydrocarbon and argon (6) inner electrode with holes for inserting gases into the bottles (7) radio frequency (13.56 MHz) power (8) pumping port connected to vacuum pumps (9) DLC film (10) chamber. A detail of FIG. 2 is similar to FIG. 1 as described above.

Figure 3:
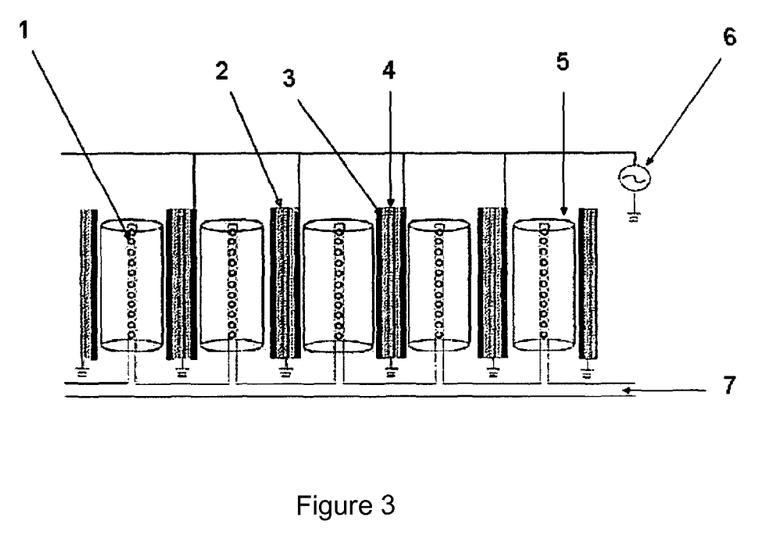
FIG. 3 is an exemplary illustration of an array of an apparatus that could be used for the deposition of DLC films on inner surfaces of cylindrical shaped plastic tube/bottles by generating capacitively coupled hydrocarbon plasma between inner and outer electrodes according to an embodiment of the present invention.

FIG. 3 describes an array of an apparatus that could be used for the deposition of DLC films on inner surfaces of cylindrical shaped plastic tube/bottles by generating capacitively coupled hydrocarbon plasma between inner and outer electrodes. This is a proposed design for DLC coating on inner surface of bottles or tubes for mass production. The components shown in FIG. 3 are similar to FIG. 1 and FIG. 2 as described above. Numbers marked in the sheet 03/03 (FIG. 3) designated as (1) inner electrode with holes for inserting gases into the bottle (2) insulating sheet (3) outer electrode/cathode (4) sheet at ground potential (5) cylindrical tube (6) radio frequency (13.56 MHz) power (7) port to insert gaseous mixture of hydrocarbon and argon.

The present invention is described with reference to the figures and specific embodiments; this description is not meant to be construed in a limiting sense. Various alternate embodiments of the invention, will become apparent to persons skilled in the art upon reference to the description of the invention. It is therefore contemplated that such alternative embodiments form part of the present invention.

Accordingly, the present invention provides a process to deposit DLC thin films on inner surface of hollow objects like plastic bottles using hollow cathode plasma enhanced chemical vapour deposition (PECVD) technique which is accomplished through the appropriate selection of various process parameters such as power density, chamber pressure, self bias, gas flow rates, temperature etc. In this process it was found that films deposited under a set of deposition parameters were adhesive and shows excellent properties, which were grown using gaseous mixture of acetylene ($C_2H_2$) diluted in argon (Ar) in a radio frequency (13.56 MHz) hollow cathode plasma enhanced chemical vapour deposition system. Process parameters were varied and optimized to enhance the diamond like properties of the films. These films were characterized for topographical properties using scanning electron microscopy (SEM) and atomic force microscopy (AFM). Surface of films was found to be smooth. Since DLC films contains large values of residual stress which hinder its use for various applications. The deposited DLC films were with very low stress. The mechanical properties of these films were characterized for hardness. Films were also characterized for estimation of optical and electrical properties. The structure of these films was found to be amorphous. Various substrates like silicon, glass, plastic sheets etc. were also placed inside the hollow cathode to perform the presume characterization of DLC coating.

The process uses the deposition of DLC films (~100 nm) to the inner surface of plastic (like PET) bottle by generating capacitvely coupled plasma between inner and outer electrodes. Here, the inner electrode is grounded that lies inside the bottles while the outer electrode is outside, touching the body of bottle which is connected to the power supply. Outer electrode is hollow and cylindrical in shape. Inventors have insulated outer electrode from out side with Pyrex sheet (5 mm thick) and all these are covered with SS sheet at ground potential, as schematically shown in FIG. 1. The first step of the process is to place a bottle in hollow cathode in a vacuum chamber and evacuated to a vacuum better than $10^{-5}$ Torr. Then hydrocarbon gas such as acetylene ($C_2H_2$) or methane ($CH_4$) diluted with Argon (Ar) is injected into the bottle through inner electrode. Then radio frequency power of 13.56 MHz is applied to the outer electrode (called cathode) to generate hydrocarbon plasma. The ions and radicals of hydrocarbon react to deposit on the inner surface of the bottles in a negative self bias potential over the outer electrode. Initially DLC film was deposited at a very low self bias (~50-70 Volts) and then self bias was increased gradually to 150-200 Volts to get the hard enough (8-12 Gpa) diamond like carbon with better adhesion on the inner surface of bottles. Prior to deposition of DLC films, Ar plasma was created at sufficiently high enough self bias inside the bottles to clean the inner surface of bottles.

The apparatus invented is not restricted to DLC coating on inner surface of hollow cylindrical shaped bottles only. DLC coating on inner surface of spherical, cube or rectangular cavity is also possible with inventor design. Depending on the shape of hollow object to be coated from inside, shape of the cathode is designed accordingly.

SEM and AFM images of DLC films were recorded. These images show the amorphous structures. Films deposited at 200-300 mW/cm² RF power density (corresponding self bias 150-200 volts) and deposition pressure in the range of 25-50 mTorr with moderate Ar dilution (40-60%) show excellent coating on inner surface of bottles. Films deposited above 400 mW/cm² powers (corresponding self bias 270 volts) and at high Ar dilution clearly reveals that there are high stresses in these films and films delaminate from the inner surface of the bottles as soon as bottle was taken out of the chamber.

It has been observed that DLC films deposited on inner surface of bottles were adhesive and scratch resistant. DLC films were also deposited on cleaned 7059 corning glass, well polished silicon and plastic sheets using gaseous mixture of acetylene ($C_2H_2$) diluted in argon (Ar). The substrates were placed inside the hollow cathode to deposit DLC films over these for the use for various measurements.

This Apparatus can also be used for DLC coating on inner surface of plastic tubes as shown in FIG. 2. Invention (as shown in FIGS. 1 & 2) can also be used for coating on inner surface of metallic cane or tube. However, a carbide forming interlayer (like amorphous silicon) is required to get the DLC films with better adhesion to inner surface of metals.

Present apparatus as shown in FIG. 1 can be easily scaled up to accommodate more than one bottle. As cathode is separated by insulator and this assembly is covered by SS sheet which is at ground potential during plasma discharge; therefore, more cathode/anode assemblies (as shown in FIG. 1) can be fixed in a vacuum chamber. This will increase the throughput for the mass production. A proposed design for mass production is shown in FIG. 3. There will be no possibility of plasma discharge out side the plastic bottle using the inventor design.

The following examples are given by way of illustration of the working of the invention in actual practice and therefore should not be construed to limit the scope of the present invention.

EXAMPLE-1

In one deposition several pieces of glass substrate (area ~1.0 cm² each) were properly cleaned by adopting standard procedures and placed on the cathode in the hollow cathode capacitively coupled PECVD chamber and the chamber was pumped to a base pressure better than le Ton using turbo pump backed by rotary pump. Actually the substrates were placed on hollow cylindrical shaped powered electrode. The source gas acetylene was let into the chamber through mass flow controllers. The acetylene flow rate of 10 sccm was maintained during the process. The chamber pressure was maintained at 25 mtorr using baratron and throttle valve and their controllers. The radio frequency (13.56 MHz) discharge was created by applying the power density of ~150 mW/cm² to cathode, corresponding self bias was −150V. The film was deposited at a rate of 0.2 A°/sec and for this film hardness and stress values were found to be 8 GPa and 0.2 GPa, respectively.

EXAMPLE-2

In another deposition several plastic sheets (area ~1.0 cm² each) were cleaned; placed on hollow cylindrical shaped cathode (the power electrode) in the system and the system was pumped to a base pressure better than $10^{-5}$ Torr. There was no deliberate heating of the substrate. The source gas acetylene was let into the chamber through mass flow controller. The acetylene ($C_2H_2$) flow rate of 20 sccm was maintained during the process. The chamber pressure was maintained at 25 mTorr using baratron and throttle valve and their controllers. The radio frequency (13.56 MHz) discharge was created by applying the power density 150 mW/cm² to cathode. The film was deposited at same rate observed in example 1. There was no delamination observed in the film.

EXAMPLE-3

In another deposition several pieces of glass, silicon wafer, plastic (area ~1.0 cm² each) substrates were cleaned and placed on hollow cylindrical shaped cathode in the chamber and the chamber was pumped to a base pressure better than $10^{-5}$ torr. There was no deliberate heating of the substrates. The source gas acetylene ($C_2H_2$) was let into the chamber through mass flow controller. The silane flow rate of 20 sccm and argon partial pressure of 20% was maintained during the process. The chamber pressure was maintained at 25 mtorr using baratron and throttle valve and their controllers. The radio frequency (13.56 MHz) discharge was created by applying the power density 200 mW/cm² to cathode. The film was deposited at a rate of 3.3 A°/sec and for this film value of hardness was found to be 12 GPa. There was no delamination observed in the film.

EXAMPLE-3 (a)

In another deposition several pieces of glass, silicon wafer, and plastic (area ~1.0 cm² each) substrates were cleaned and placed on hollow cylindrical shaped cathode in the chamber and the chamber was pumped to a base pressure better than $10^{-5}$ torr. There was no deliberate heating of the substrates. The source gas acetylene ($C_2H_2$) was let into the chamber through mass flow controller. The silane flow rate of 20 sccm and argon partial pressure of 40% was maintained during the process. The chamber pressure was maintained at 25 mtorr using baratron and throttle valve and their controllers. The radio frequency (13.56 MHz) discharge was created by applying the power density 200 mW/cm² to cathode. The film was deposited at a rate of 1.3 A° /sec and for this film value of hardness was found to be 14 GPa. There was no delamination observed in the film.

EXAMPLE-3 (b)

In another deposition several pieces of glass, silicon wafer, and plastic (area ~1.0 cm² each) substrates were cleaned and placed on hollow cylindrical shaped cathode in the chamber and the chamber was pumped to a base pressure better than $10^{-5}$ torr. There was no deliberate heating of the substrates. The source gas acetylene ($C_2H_2$) was let into the chamber through mass flow controller. The silane flow rate of 20 sccm and argon partial pressure of 60% was maintained during the process. The chamber pressure was maintained at 25 mtorr using baratron and throttle valve and their controllers. The radio frequency (13.56 MHz) discharge was created by applying the power density 200 mW/cm² to cathode. The film was deposited at a rate of 1.0 A°/sec and for this film value of hardness was found to be 15 GPa. There was no delamination observed in the film.

EXAMPLE-4

In another deposition plastic sheet (area ~200 cm²) was cleaned and placed on the cathode (as rolled to the surface of cathode) and the chamber was pumped to a base pressure better than $10^{-5}$ torr. There was no deliberate heating of the substrates. Then, the source gas acetylene ($C_2H_2$) was let into the system through mass flow controller. The chamber pressure was maintained at 25 mtorr using baratron and throttle valve and their controllers. Radio frequency (13.56 MHz) discharge was created by applying the power density 300 mW/cm² to cathode. The film was deposited at a rate of 3.1 A°/sec. The deposited film was hard, unscratchable and adhesive.

EXAMPLE-5

In another deposition plastic sheet (area ~200 cm²) of same area as in example 4 was cleaned and placed on the cathode (as rolled to the surface of cathode) and the chamber was pumped to a base pressure better than $10^{-5}$ torr. There was no deliberate heating of the substrates. Then, the source gas acetylene ($C_2H_2$) was let into the system through mass flow controller. The chamber pressure was maintained at 50 mtorr using baratron and throttle valve and their controllers. Radio frequency (13.56 MHz) discharge was created by applying the power density 300 mW/cm² to cathode. The film was deposited at a rate of 3.1 A°/sec and for this film was hard, unscratched able and adhesive.

EXAMPLE-6

In another deposition small pieces of plastic sheets (area ~1-1.5 cm² each) were cleaned by adopting RCA procedure and placed on hollow cylindrical shaped cathode and the chamber was pumped to a base pressure better than $10^{-5}$ torr. There was no deliberate heating of the substrates. Then, the source gas acetylene ($C_2H_2$) was let into the chamber through mass flow controller. The chamber pressure was maintained at 50 torr using baratron and throttle valve and their controllers. The radio frequency (13.56 MHz) discharge was created by applying the power density of 400 mW/cm² to cathode. The film was deposited at a rate of 4.7 A°/sec and for this film was hard, unscratched able and adhesive.

EXAMPLE-7

A plastic bottle was cleaned and inserted in the hollow area of cathode and gas tube (with holes to deliver source gas acetylene into the bottle) was placed in the center of bottles. All these are placed in the chamber and the chamber was pumped to a base pressure better than $10^{-5}$ torr. The source gas acetylene was let into the tube that was placed in the bottle through mass flow controller. The chamber pressure was maintained at 25 mtorr using baratron and throttle valve and their controllers. The radio frequency (13.56 MHz) discharge was created by applying the power density 300 mW/cm² to cathode. The a-C:H film was deposited at a rate of 2.6 A°/sec. a-C:H coated bottle was filled with water. There was no delamination of film was observed.

EXAMPLE-8

A plastic bottle was cleaned and inserted in the hollow area of cathode and gas tube was placed in the center of bottles. All these are placed in the chamber and the chamber was pumped to a base pressure better than $10^{-5}$ torr. The source gas acetylene was let into the tube that was placed in the bottle through mass flow controller. The chamber pressure was maintained at 50 mtorr using baratron and throttle valve and their controllers. The radio frequency (13.56 MHz) discharge was created by applying the power density 200 mW/cm² to cathode. The a-C:H film was deposited at a rate of 3.0 A°/sec. a-C:H coated bottle was filled with water. There was no delamination of film was observed.

EXAMPLE-9

A plastic bottle was cleaned and inserted in the hollow area of cathode and gas tube was placed in the center of bottles. All these are placed in the chamber and the chamber was pumped to a base pressure better than $10^{-5}$ torr. The source gas acetylene was let into the tube that was placed in the bottle through mass flow controller. The chamber pressure was maintained at 50 mtorr using baratron and throttle valve and their controllers. The radio frequency (13.56 MHz) discharge was created by applying the power density 300 mW/cm² to cathode. The a-C:H film was deposited at a rate of 2.8 A°/sec. a-C:H coated bottle was filled with water. There was no delamination of film was observed.

EXAMPLE-10

A plastic bottle was cleaned and inserted in the hollow area of cathode and gas tube was placed in the center of bottles. All these are placed in the chamber and the chamber was pumped to a base pressure better than $10^{-5}$ torr. The source gas acetylene was let into the tube that was placed in the bottle through mass flow controller. The chamber pressure was maintained at 25 mtorr using baratron and throttle valve and their controllers. The radio frequency (13.56 MHz) discharge was created by applying the power density 300 mW/cm² to cathode. The a-C:H film was deposited at a rate of 1.8 A°/sec. a-C:H coated bottle was filled with water. There was no delamination of film was observed.

EXAMPLE-11

A metallic tube (that also act as cathode) was cleaned and inserted in the hollow area of cathode and gas tube was placed in the center of bottles. All these are placed in the chamber and the chamber was pumped to a base pressure better than $10^{-5}$ torr. Initially thin layer of amorphous silicon was deposited on inner surface of metallic tube using silane ($SiH_4$) gas. Then source gas acetylene (along with argon) was let into the metallic tube that was also working as cathode. The chamber pressure was maintained at 25 mtorr using baratron and throttle valve and their controllers. The radio frequency (13.56 MHz) discharge was created by applying the power density 300 mW/cm² to cathode. The a-C:H film was deposited at a rate of 1.5 A°/sec. There was no delamination of film was observed.

Advantages of the Present Invention
1. There is a huge demand of polyethylene terephthalate (PET) or polyethylene naphthalate (PEN) bottles, meant for the storage of potable water, carbonated soft drinks, wines, medicines etc. However, the higher cost prohibits their wide spread use. The cheaper alternative is to use plastic bottles inside coated with chemically inert material such as Diamond-Like Carbon (DLC).
2. Ion bombardment on the surface of PET (or any other plastic) bottles is avoided due to energy of ions used ~60-80 eV with corresponding self bias 150-200 Volts to get hard enough (8-12 GPa) diamond like carbon films with better adhesion on the inner surface of the shaped object.
3. The single outer electrode called cathode in the apparatus is separated by an insulator from outside being covered by metallic sheet at ground potential to provide radio frequency shielding with no possibility of plasma discharge outside the plastic bottle.
4. The process is not restricted to DLC coating on inner surface of hollow cylindrical shaped bottles only. DLC coating on inner surface of spherical, cube or rectangular cavity is also possible with inventor design.
5. The process and apparatus can be scaled up for the accommodation of more than one bottle which will increase the throughput for the mass production.

We claim:
1. A process for deposition of diamond like carbon (DLC) films having enhanced adhesion and reduced stress as a protective coating on an inner surface of a shaped object such as a container, said process comprising the steps of:
 i. cleaning the inner surface of the shaped object using an inert gas and placing the object inside a hollow cathode plasma enhanced chemical vapor deposition apparatus kept in a vacuum chamber;
 ii. applying a base pressure of $10^{-5}$ to $10^{-6}$ torr to the vacuum chamber for removing the residual gases;
 iii. injecting a hydrocarbon gas diluted in argon at a partial pressure in the range of 10-90% into the shaped object through holes of an inner electrode;
 iv. applying a radio frequency of 13.56 MHz for a time period in the range of 8 to 10 mins to an outer electrode of the hollow cathode, wherein the outer electrode is in contact with the body of the shaped object and is connected to a power supply and the inner electrode lying inside the shaped object being used for delivery of the hydrocarbon gas, the outer electrode being insulated from outside using an insulating sheet and entire assembly being covered with a metal sheet which is at ground potential;
 v. depositing the DLC films at a power density in the range of 50-2000 mW/cm² to the outer electrode, gas flow in the range of 5-100 sccm, chamber pressure in the range of 5-100 m torr and applying a self bias in the range of 50-200 volts such that initially the self bias is in the range of 50-70 volts and gradually increasing the self bias in the range of 150-200 volts, and temperature in the range of 25-30° C.; and
 vi. breaking of vacuum by inserting air, to take out the DLC coated shaped object from the chamber;
 wherein a thin layer consisting of hydrogenated amorphous silicon (a- Si:H) is deposited using silane ($SiH_4$) plasma discharge prior to deposition of a thick DLC layer of about a micron wherein the thick DLC layer on an inner surface of a plastic or metallic object facilitates better adhesion of DLC with the inner surface of the plastic or metallic object.
2. The process as claimed in claim 1, wherein the shaped object or the container is a plastic or metal container.
3. The process as claimed in claim 1, wherein the step of depositing of diamond like carbon (DLC) film is initially carried out at a self bias in the range of 50-70 volts for 1 to 2 minutes on the inner surface of a plastic or metallic object used and thereafter the self bias is gradually increased in the range of 150-200 volts for 8 to 10 minutes to get the hard DLC films.
4. The process as claimed in claim 1, wherein the shaped object is selected from the group consisting of spherical, cubic, cylindrical or rectangular shaped objects and such similar shaped objects and the shape of the hollow cathode used for DLC coating corresponds to the shape of the object used for coating.
5. The process as claimed in claim 1, wherein energy of ions is in the range of 60-80 -eV to achieve the hard DLC film with better adhesion on the inner surface of the shaped object in the range of 8 to 12 GPa.
6. The process as claimed in claim 1, wherein the hydrocarbon gas is selected from the group consisting of acetylene, methane, benzene, cyclohexane, n-hexane, and toluene.

7. The process as claimed in claim 1, wherein the self bias applied is directly proportional to applied Rf power and inversely proportional to pressure and the self bias is controlled to obtain the desired properties of DLC films over the inner surface of plastic or metallic object.

8. The process as claimed in claim 1, wherein the shaped object is a bottle.

9. The process as claimed in claim 1, wherein the power density ranges from 300-500 mW/cm$^2$.

10. The process as claimed in claim 1, wherein the DLC film is deposited at a rate ranging from 0.2 Å/sec to 4.7 Å/sec.

11. The process as claimed in claim 1, wherein the DLC film has a hardness that increases from 8 GPa to 12 GPa as the self bias increases from 150 volts to 200 volts.

12. The process as claimed in claim 1, wherein the DLC film has a stress ranging from 0.2 GPa to 0.5 GPa.

13. The process as claimed in claim 1, wherein the DLC film has a hardness in the range from 8 to 15 GPa.

14. The process as claimed in claim 13, wherein the DLC film has a stress in the range from 0.2 GPa to 0.5 GPa.

15. The process as claimed in claim 13, wherein the DLC film has a hardness in the range from 12 to 15 GPa.

16. The process as claimed in claim 15, wherein the DLC film has a stress in the range from 0.2 GPa to 0.5 GPa.

17. The process as claimed in claim 1, wherein the hydrocarbon gas is diluted in argon at a partial pressure in the range of 40-60%.

* * * * *